United States Patent
Okamoto et al.

(10) Patent No.: US 6,806,118 B2
(45) Date of Patent: Oct. 19, 2004

(54) ELECTRODE CONNECTION METHOD, ELECTRODE SURFACE ACTIVATION APPARATUS, ELECTRODE CONNECTION APPARATUS, CONNECTION METHOD OF ELECTRONIC COMPONENTS AND CONNECTED STRUCTURE

(75) Inventors: Keishiro Okamoto, Kawasaki (JP); Masataka Mizukoshi, Kawasaki (JP); Yasuo Yamagishi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/347,224

(22) Filed: Jan. 21, 2003

(65) Prior Publication Data

US 2003/0148593 A1 Aug. 7, 2003

(30) Foreign Application Priority Data

Feb. 7, 2002 (JP) ...................................... 2002-031025
Feb. 7, 2002 (JP) ...................................... 2002-031089

(51) Int. Cl.[7] .......................... H01L 21/44; H01L 21/48; H01L 21/50
(52) U.S. Cl. ...................................... 438/108; 438/110
(58) Field of Search ............................... 438/108, 109, 438/110, 615

(56) References Cited

U.S. PATENT DOCUMENTS

| 5,866,475 | A | * | 2/1999 | Yanagida | 438/613 |
| 5,877,079 | A | * | 3/1999 | Karasawa et al. | 438/613 |
| 5,956,606 | A | * | 9/1999 | Burnette | 438/615 |
| 5,985,692 | A | * | 11/1999 | Poenisch et al. | 438/106 |
| 6,219,911 | B1 | * | 4/2001 | Estes et al. | 29/840 |
| 6,471,115 | B1 | * | 10/2002 | Ijuin et al. | 228/180.22 |
| 6,599,777 | B2 | * | 7/2003 | Murakami | 438/108 |
| 2001/0042923 | A1 | * | 11/2001 | Yanagida | 257/779 |

FOREIGN PATENT DOCUMENTS

| JP | 11-87561 | 3/1999 |
| JP | 11-274224 | 10/1999 |

* cited by examiner

Primary Examiner—George Fourson
Assistant Examiner—Fernando L. Toledo
(74) Attorney, Agent, or Firm—Armstrong, Kratz, Quintos, Hanson & Brooks, LLP

(57) ABSTRACT

An electrode connecting method of connecting a first electrode and a second electrode is disclosed. The respective bonding surfaces of the first and second electrodes are activated. Then, each of the first and second electrodes having the activated surfaces is coated with a coating member for maintaining an activated state. A solid state bond between the first electrode and the second electrode is formed by pressure welding the first electrode and the second electrode so that the first and second electrodes break through the coating members.

14 Claims, 8 Drawing Sheets

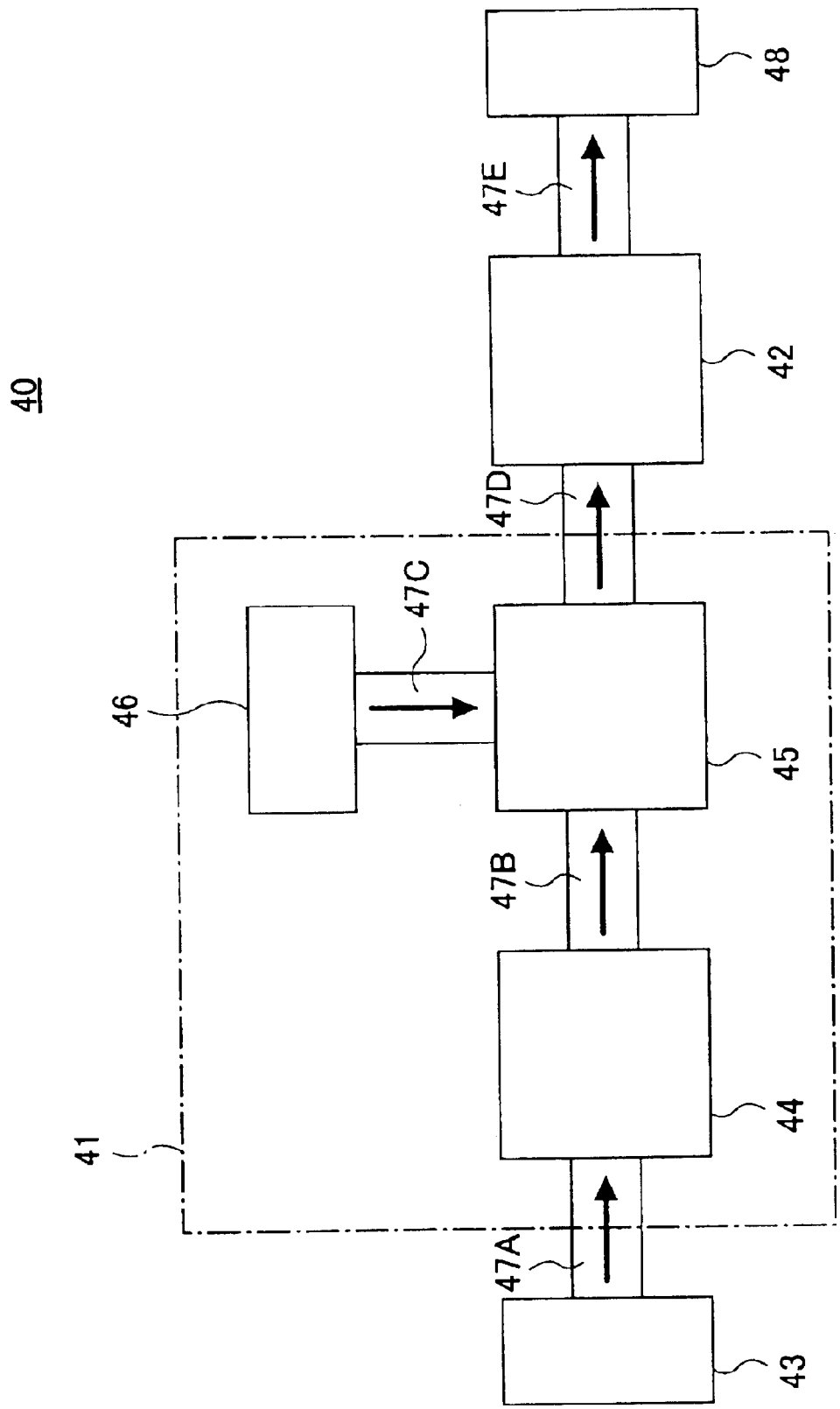

ELECTRODE CONNECTION METHOD, ELECTRODE SURFACE ACTIVATION APPARATUS, ELECTRODE CONNECTION APPARATUS, CONNECTION METHOD OF ELECTRONIC COMPONENTS AND CONNECTED STRUCTURE

CROSS-REFERENCE TO RELATED APPLICATIONS

This application is based upon and claims the benefit of priority from the prior Japanese Patent Applications No. 2002-031089 filed on Feb. 7, 2002 and No. 2002-031025 filed on Feb. 7, 2002, the entire contents of which are incorporated herein by reference.

BACKGROUND OF THE INVENTION

1. Field of the Invention

The present invention relates to electrode connection methods, electrode surface activation apparatuses, electrode connection apparatuses, connection methods of electronic components, and more particularly to an electrode connection method, an electrode surface activation apparatus and an electrode connection apparatus that connect electrodes by solid state bonding, a method of directly connecting components to be connected via the respective electrodes, and a connected structure including electrical components connected by the method.

2. Description of the Related Art

The demand for high density mounting of electronic components is increasing based on smaller and thinner electronic equipment of these years. Thus, when connecting an electronic component such as a semiconductor chip to a board, a mounting method of flip chip bonding a bare chip provided with protruding electrodes (bumps) to a board is often employed. Protruding electrodes are formed on a semiconductor chip used for flip chip bonding, and it is necessary to electrically connect the protruding electrodes to the wiring on the board.

The major example of protruding electrodes of an electronic component is solder bumps. There is the reflow soldering method as a method of connecting the electronic component to the circuit board in a case where the solder bumps are used. In the reflow soldering method, flux for eliminating an oxide film on the solder is applied to the electrodes on a board so as to improve the solder bonding. Then, the electronic component is positioned and mounted on the board. Thereafter, the electronic component and the board are electrically connected by the reflow such that the solder bumps are melted in a furnace having an air atmosphere or a nitrogen atmosphere so as to wet the electrodes of the board with the melted solder and spread the solder on the electrodes. Generally, the electronic component and the circuit board are mechanically connected by filling and curing a resin for sealing between the electronic component and the circuit board. The reflow soldering method is also employed when forming a stacked structure by stacking electronic components.

Recently, solid state bonding has been attracting attention as a method of mounting a highly integrated smaller semiconductor device to a board at low temperature and low pressure with high reliability and low damage. As a specific connection method of solid state bonding, a method is known where bonding surfaces of electrodes (for example, the electrodes of a semiconductor device and the electrodes of a board to which electrodes the electrodes of the semiconductor are connected) are placed in direct contact with each other and pressed so as to form a solid state bond. More specifically, a method is known where a firm bond (solid state bond) is formed between metal atoms at room temperature, after activating the surface of the metal forming the electrodes by eliminating an oxide film existing on the surfaces of the electrodes.

However, when a pollutant or an oxide film such as an oxide exists on the bonding surfaces, it is impossible to form a firm solid state bond of metal atoms. Accordingly, when forming the solid state bond, the elimination of the oxide film and activation are performed on the bonding surfaces.

As specific methods of eliminating the oxide film of the bonding surfaces so as to activate the bonding surfaces, there are a method of irradiating an inert gas ion beam or an inert gas high-speed atom beam on the bonding surfaces, a method of applying ultrasonic waves to the bonding surfaces, a method of applying friction to the bonding surfaces, and so on.

In addition, after activating the electrodes by the above-described methods, until the electrodes are connected to each other, it is necessary to maintain the state where the surfaces of the electrodes are activated. This is because even if the elimination of the oxide film of the bonding surfaces and the activation process of the bonding surfaces are performed, when the bonding surfaces are returned (exposed) to the air, the oxide film is formed on the bonding surfaces again.

Therefore, conventionally, when the elimination of the oxide film and the activation process end, the activated electrodes are maintained in a vacuum or an inert gas atmosphere. Further, the connecting process of the electrodes is performed in the same atmosphere.

However, when the above-described conventional methods are employed, until the solid state bond is formed after the activation of the electrode surfaces, it is necessary to maintain the state where the electrodes are activated. For this reason, a mechanism is required for maintaining the electrode surfaces in the vacuum or the inert gas atmosphere.

Accordingly, it is impossible to use a flip chip bonder capable of connecting the components in the air and having a high mounting speed. Thus, there has been a problem in that the efficiency of the connecting process of the electrodes is degraded. In addition, in order to make the connecting process more efficient, when the mechanism for realizing the inactive gas atmosphere is provided to the flip chip bonder, the equipment becomes complex and expensive. Thus, the equipment cost increases.

In addition, in the above-described reflow soldering by the solder bumps, since the melting point of the solder is generally high such as equal to or more than 200° C., there is a possibility of the electronic component being thermally damaged. Moreover, shorts tend to occur between the adjacent electrodes when the solder melted in the reflow flows out from the electrode areas. Further, since the thermal expansion coefficient of the electronic component and the thermal expansion coefficient of the circuit board are different, shearing stress and strain are applied to the bonded parts connected by the reflow solder. Accordingly, the reliability of the connection is likely to be reduced.

On the other hand, in the method of forming the solid state bond such that the bonding surfaces are in direct contact with and pressed against each other after cleaning and activating the electrode surfaces of the components to be connected, it is difficult to achieve firm connection. The reason is that, since irregularities on the order of submicrons or microns originally exist on the electrode surfaces, the planarization of the electrode surfaces is difficult to achieve even if the electrode surfaces are cleaned, and thus the effective contact area of the electrodes is small. When the force on the connection is increased so as to improve the connection strength, the electronic component may be damaged. Additionally, when a polarization process such as the chemical-mechanical polishing (CMP) is performed so as to eliminate the irregularities on the electrode surfaces, problems such as an increase in the manufacturing cost and an increase in the TAT (turn around time) arise.

SUMMARY OF THE INVENTION

It is a general object of the present invention to provide an improved and useful electrode connection method, electrode surface activation apparatus, electrode connection apparatus, and connection method of electronic components in which the above-mentioned problems are eliminated.

It is another and more specific object of the present invention to provide an electrode connecting method, electrode surface activation apparatus, and electrode connecting apparatus that can simply and inexpensively form a solid state bond between electrodes.

It is still another object of the present invention to provide a method enabling the connection between an electronic component and a mounting board such as a circuit board or between electronic components with high reliability at low temperature and low load in which the above-described problems in the prior art are eliminated.

In order to achieve the above-mentioned objects, according to one aspect of the present invention, there is provided an electrode connecting method of connecting a first electrode and a second electrode, including the steps of: (a) activating respective bonding surfaces of the first and second electrodes; (b) coating each of the first and second electrodes having the activated surfaces with a coating member for maintaining the activated state; and (c) forming a solid state bond between the first and second electrodes by pressure welding the first and second electrodes so that the first and second electrodes break through the coating members.

According to the above-mentioned aspect of the present invention, the bonding surfaces are sealed (coated) with the coating member after performing the activation process on the bonding surfaces of the first and second electrodes. Thus, it is possible to maintain the state where the bonding surfaces are activated even when the first and second electrodes are placed (exposed) in the air.

In addition, when forming the solid state bond between the respective bonding surfaces of the first and second electrodes, each of the electrodes breaks through the coating member so as to form the solid state bond. Therefore, it is possible to form the solid state bond in the air. Hence, it is possible to correspond to the mass production process since the connecting in the air according to the flip chip method can be applied.

Additionally, according to another aspect of the present invention, in the above-described electrode connecting method, the activation may be performed by eliminating the oxide formed on the bonding surfaces, when activating the respective bonding surfaces of the first and second electrodes.

According to the above-mentioned aspect of the present invention, it is possible to connect the electrodes while maintaining the state where the surfaces of the electrodes of electronic components are activated by eliminating the oxide formed on the surfaces of the electrodes. For this reason, it is possible to achieve the improvement in the yield of the connecting process since the solid state bond having high reliability can be achieved with low temperature and low load.

In addition, according to another aspect of the present invention, in the above-described electrode connecting method, etching by irradiating plasma may be used as the activation process of activating the respective bonding surfaces of the first and second electrodes.

According to the above-mentioned aspect of the present invention, the bonding surfaces are activated by the plasma etching. Thus, it is possible to positively activate a plurality of electrodes at a high throughput.

Further, according to another aspect of the present invention, in the electrode connecting method, the reduction of a formic acid may be used as the activation process of activating the respective bonding surfaces of the first and second electrodes.

According to the above-mentioned aspect of the present invention, the bonding surfaces are activated by using the reduction of the formic acid. Hence, it is possible to surely activate the plurality of electrodes with inexpensive equipment.

Additionally, according to another aspect of the present invention, in the electrode connecting method, an adhesive film having an electrical insulation property may be used as the coating member for maintaining the activated state.

According to the above-mentioned aspect of the present invention, it is possible to easily perform the coating process for maintaining the activated state of the electrodes by using, as the coating member, an adhesive film having an electrical insulation property. In addition, it is possible to correspond to the automation of the coating process of the electrodes with ease.

Furthermore, according to another aspect of the present invention, in the electrode connecting method, the coating process of coating the first and second electrodes with the coating member may be performed in an inert gas atmosphere.

According to the above-mentioned aspect of the present invention, it is possible to maintain the activated state of the electrodes more positively, since the air causing the oxidization of the electrodes does not exist in between each of the electrodes and the coating member.

Additionally, according to another aspect of the present invention, in the electrode connecting method, the first and second electrodes may be protruding electrodes formed on the respective boards.

According to the above-mentioned aspect of the present invention, since the first and second electrodes are the protruding electrodes, when forming the solid state bond between the first and second electrodes by breaking through the coating member by the first and second electrodes, it is possible to positively perform the process of breaking through the coating member. Thus, it is possible to prevent the coating member from remaining in between the electrodes.

In addition, according to another aspect of the present invention, there is provided an electrode surface activation apparatus activating surfaces of electrodes, including: a first apparatus activating bonding surfaces of the electrodes; and a second apparatus coating the electrodes of which bonding surfaces are activated with a coating member for maintaining an activated state.

According to the above-mentioned aspect of the present invention, the bonding surfaces of the electrodes are activated by the first apparatus, and the activated electrodes are coated with the coating member by the second apparatus. Hence, it is possible to perform the process of applying the coating member to the electrodes with a simple construction.

In addition, according to another aspect of the present invention, in the above-described electrode surface activation apparatus, the first apparatus may activate the bonding surfaces of the electrodes by eliminating the oxide film formed on the bonding surfaces.

Further, according to another aspect of the present invention, in the above-described electrode surface activation apparatus, the first apparatus may etch the bonding surfaces by irradiating plasma so as to activate the bonding surfaces.

Additionally, according to another aspect of the present invention, in the electrode surface activation apparatus, the first apparatus may activate the bonding surfaces by using the reduction of formic acid.

Furthermore, according to another aspect of the present invention, in the electrode surface activation apparatus, an adhesive film having an electrical insulation property may be used as the coating member for maintaining the activated state.

In addition, according to another aspect of the present invention, in the electrode surface activation apparatus, the second apparatus may perform the process of coating the electrode with the coating member in an inert gas atmosphere.

Further, according to another aspect of the present invention, there is provided an electrode connecting apparatus, including an electrode surface activation apparatus and a bonding apparatus, the electrode surface activation apparatus including: a first apparatus activating bonding surfaces of the electrodes by eliminating an oxide on the bonding surfaces; and a second apparatus coating the electrodes with a coating member for maintaining an activated state, the electrodes having activated bonding surfaces, the bonding apparatus forming a solid state bond between a pair of electrodes by pressure welding the pair of electrodes so that the electrodes break through the coating member, the pair of electrodes having bonding surfaces activated by the electrode surface activation apparatus.

As mentioned above, according to the present invention, the bonding surfaces of the electrodes are activated by the electrode surface activation apparatus, the activated state of the electrodes are maintained by the coating member, and the electrodes are connected by the bonding apparatus. Accordingly, it is possible to form the solid state bond having high reliability in the bonding with low temperature and low load. At the same time, it is possible to correspond to the mass production processes, and thus the production cost can be reduced drastically.

Furthermore, according to another aspect of the present invention, there is provided a method of directly connecting components via respective electrodes, each components having an electrode and at least one of the components being an electronic component, including the steps of: (a) applying a metal material having a Young's modulus equal to or less than 50 GPa to a surface of the electrode of at least one of the components; (b) activating a surface of the metal material and a surface of the electrode of the other component when the metal material is not applied to the surface of the electrode thereof; and (c) connecting the components by forming a solid state bond between the respective electrodes of the components via the applied metal material.

According to the above-mentioned aspect of the present invention, the respective electrodes of the components are connected while maintaining a state where the oxide on the electrode surface of the component and the oxide on the surface of the metal material for bonding are eliminated and activated. Thus, it is possible to form a solid state bond having high reliability in the connection between the components at low temperature and low load. At the same time, in the solid state bonding, the metal material for bonding does not flow out of the electrode areas, or the amount is very small even if the metal material flows out. Therefore, it is possible to effectively prevent the occurrence of a short between the adjacent electrodes, compared with the connection by reflow. Hence, it is possible to improve the yield of minute/narrow pitch connections of the semiconductor devices. In addition, labor-hours can be reduced since a leveling process such as CMP before connecting is not required.

Other objects, features and advantages of the present invention will become more apparent from the following detailed description when read in conjunction with the following drawings.

BRIEF DESCRIPTION OF THE DRAWINGS

FIG. 2 is a block diagram for explaining an electrode surface activation apparatus and an electrode connecting apparatus according to a second embodiment of the present invention;

DETAILED DESCRIPTION OF THE PREFERRED EMBODIMENTS

A description will be given of embodiments of the present invention, with reference to the drawings.

FIGS. 1A, 1B, and 3A through 8 are process drawings for explaining an electrode connection method according to a first embodiment of the present invention. FIG. 2 is a schematic block diagram of an electrode surface activation apparatus and an electrode connection apparatus according to a second embodiment of the present invention.

In the following, a description will be given of an example where component-side electrodes 12 formed on an electronic component 10 and board-side electrode 22 formed on a circuit board 20 are connected. However, the present invention is not limited to the connection of the electronic component 10 and the circuit board 20, but can be widely applied to the connection of electrodes.

Figure 1A:
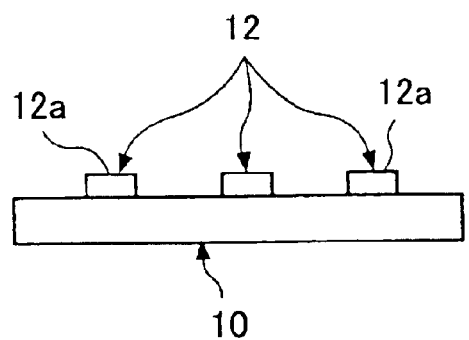
FIG. 1A is a side view showing an electronic component before an activation process and for explaining an electrode connection method according to a first embodiment of the present invention.
Figure 1B:
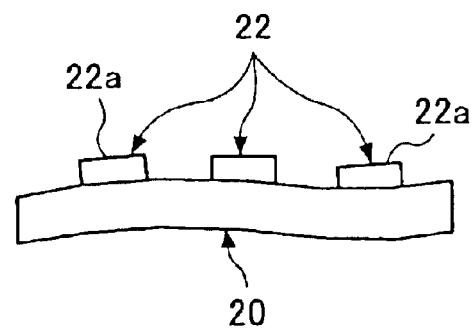
FIG. 1B is a side view showing a circuit board before the activation process and for explaining the electrode connection method according to the first embodiment of the present invention.

FIGS. 1A and 1B show the electronic component 10 and the circuit board 20, respectively, before starting an electrode connection process. The electronic component 10 is a semiconductor chip, for example, and a plurality of component-side electrodes 12 are formed thereon.

Additionally, the circuit board 20 is a board on which the electronic component 10 is to be mounted. The circuit board 20 is a flexible board, for example. The board-side electrodes 22 corresponding to the electronic component 10 are formed in the predetermined location where the electronic component 10 is to be mounted.

The component-side electrodes 12 formed on the electronic component 10 and the board-side electrodes 22 formed on the circuit board 20 are each protruding electrodes formed by electroless plating, for instance. Accordingly, the electrodes 12 and 22 are each protruding from the electrode forming surface of the electronic component 10 and the electrode forming surface of the circuit board 20, respectively.

A description will be given of an electrode connection apparatus 40 used for connecting the electronic component 10 and circuit board 20 having the above-described structure.

FIG. 2 is a schematic block diagram of the electrode connection apparatus 40. The electrode connection apparatus 40 generally includes an electrode surface activation apparatus 41 and a connecting apparatus 42. Further, the electrode surface activation apparatus 41 generally includes an activation apparatus 44, a coating apparatus 45, a film loader 46 and the like.

The activation apparatus 44 is the apparatus eliminating an oxide from and activating component-side bonding surfaces 12a and board-side bonding surfaces 22a that are surfaces of the component-side electrodes 12 and the board-side electrodes 22, respectively. In this embodiment, a plasma etching apparatus is used in the activation apparatus 44.

The coating apparatus 45 is the apparatus for coating, with an adhesive film 30, the component-side electrodes 12 and board-side electrodes 22 that are activated by the activation apparatus 44. Thus, the coating apparatus 45 is connected to the film loader 46 for supplying the adhesive film 30 to the coating apparatus 45. The adhesive film 30 is carried to the coating apparatus 45 by the carrying apparatus 47C.

On the other hand, the connecting apparatus 42 performs solid state bonding on the component-side bonding surfaces 12a of the component-side electrodes 12 and the board-side bonding surfaces 22a of the board-side electrode 22 that are activated. In this embodiment, a flip chip bonder is used as the connecting apparatus 42.

A loader 43 contains the electronic component 10 and the circuit board 20 in the state shown in FIGS. 1A and 1B, respectively. The electronic component 10 and the circuit board 20 are carried to the activation apparatus 44 at predetermined timings. In addition, an unloader 48 contains the electronic component 10 and the circuit board 20 that are integrated by the solid state bonding of component-side electrodes 12 and the board-side electrodes 22. Further, carrying apparatuses 47A through 47E carry the electronic component 10 and the circuit board 20, or the adhesive film 30 among the apparatuses 42 through 48.

Next, referring to FIGS. 3A through 8, a detailed description will be given of the connection process of the electronic component 10 and the circuit board 20 performed by using the electrode connection apparatus 40 shown in FIG. 2.

The electronic component 10 and the circuit board 20 shown in FIGS. 1A and 1B, respectively, are contained in the loader 43 of the electrode connection apparatus 40. The carrying apparatus 47A carries the electronic component 10 and the circuit board 20 to the activation apparatus 44 of the electrode surface activation apparatus 41 at the predetermined intervals.

Figure 3A:
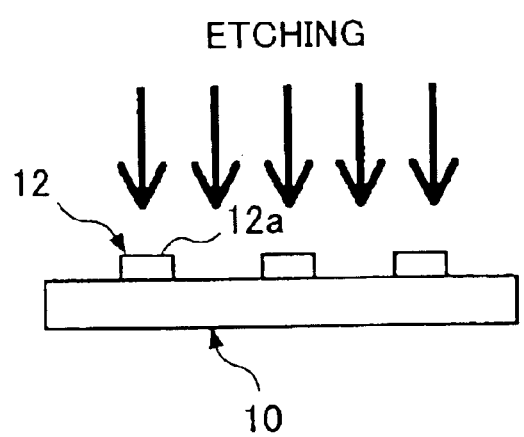
FIG. 3A is a side view showing the electronic component in a state where the activation process is performed on electrodes and for explaining the electrode connecting method according to the first embodiment of the present invention.
Figure 3B:
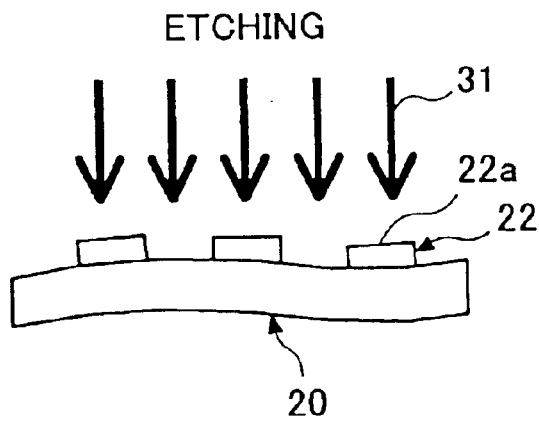
FIG. 3B is a side view showing the circuit board in a state where the activation process is performed on electrodes and for explaining the electrode connecting method according to the first embodiment of the present invention.

The activation apparatus 44 is a plasma etching apparatus. The electronic component 10 and the circuit board 20 are carried to a chamber of the activation apparatus 44 maintaining an atmosphere in which argon plasma can be irradiated. Then, in the activation apparatus 44, an etching process is performed such that the argon plasma is irradiated to the component-side bonding surfaces 12a of the component-side electrodes 12 and to the board-side bonding surfaces 22a of the board-side electrodes 22. FIGS. 3A and 3B show states where the argon plasma is irradiated to the component-side bonding surfaces 12a and the board-side bonding surfaces 22a, respectively.

By performing the plasma etching process in this manner, the contamination such as the oxide film, moisture, and fats and oils existing on the surfaces of each of the electrodes 12 and 22 is eliminated, and the bonding surfaces 12a and 22a of the electrodes 12 and 22, respectively, are activated.

Additionally, by activating the component-side bonding surfaces 12a and the board-side bonding surfaces 22a employing the plasma etching as in this embodiment, it is possible to positively activate the bonding surfaces 12a and 22a of the plurality of electrodes 12 and 22, respectively, at a high throughput.

Further, the method of eliminating the oxide on each of the bonding surfaces 12a and 22a so as to perform the activation is not limited to the above-described plasma etching process. For example, it is possible to activate the bonding surfaces 12a and 22a of the electrodes 12 and 22, respectively, by spraying the steam of heated carboxylic acid (formic acid of 250° C., for example) on the surfaces of each of the electrodes 12 and 22 so as to eliminate the contamination by the reduction of the carboxylic acid. In a case where such an activation method is employed, the equipment cost can be reduced compared with the plasma etching.

When the activation process ends, the activation apparatus 44 is purged with an inert gas so as to maintain the activated state of each of the bonding surfaces 12a and 22a of the electronic component 10 and the circuit board 20, respectively. Then, the electronic component 10 and the circuit board 20 are carried to the coating apparatus 45 by using the carrying apparatus 47B of which carrying line is in the inert gas atmosphere.

The inside of the coating apparatus 45 is also in the inert gas. Thus, during the carrying process from the activation process 44 to the coating apparatus 45, the activated state of each of the bonding surfaces 12a and 22a is not degraded. Further, the atmospheres of the activation apparatus 44, the coating apparatus 45 and the carrying apparatus 47B are not limited to the inert gas atmosphere. However, another atmosphere (vacuum atmosphere, for example) may be set as long as the activated state of each of the bonding surfaces 12a and 22 is maintained.

As mentioned above, the film loader 46 is connected to the coating apparatus 45. The film loader 46 is constructed so as to supply adhesive films 30A and 30B to the coating apparatus 45.

The film loader 46 performs a process of coating the activated component-side electrodes 12 with the adhesive film 30A transferred from the film loader 44 and a process of coating the activated board-side electrodes 22 with the adhesive film 30B. It should be noted that the adhesive film 30 is the general term for the adhesive films 30A and 30B.

Figure 4A:
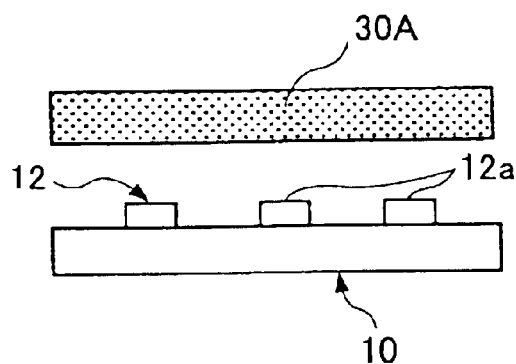
FIG. 4A is a side view showing the electronic component when an adhesive film is applied to the electrodes and for explaining the electrode connection method according to the first embodiment of the present invention.
Figure 4B:
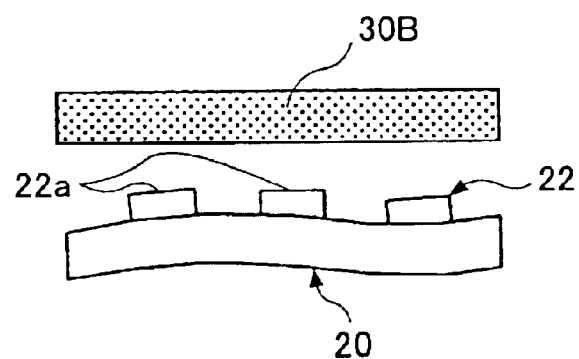
FIG. 4B is a side view showing the circuit board when an adhesive film is applied to the electrodes and for explaining the electrode connection method according to the first embodiment of the present invention.

More specifically, as shown in FIGS. 4A and 4B, the adhesive films 30A and 30B supplied from the film loader 46 are arranged above the electrode forming surfaces of the electronic component 10 and the circuit board 20, respectively. Subsequently, pressure is applied on the adhesive films 30A and 30B by a pressure board (not shown) toward the electronic component 10 and the circuit board 20, respectively. Thereafter, the pressure applied inside the coating apparatus 45 is decreased.

Figure 5A:
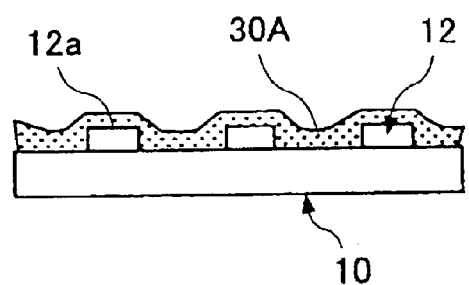
FIG. 5A is a side view showing the electronic component in a state where the activated electrodes are coated with the adhesive film and for explaining the electrode connection method according to the first embodiment of the present invention.
Figure 5B:
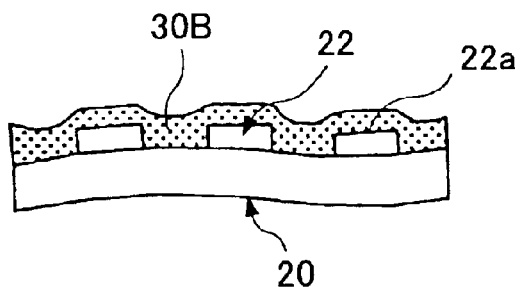
FIG. 5B is a side view showing the circuit board in a state where the activated electrodes are coated with the adhesive film and for explaining the electrode connection method according to the first embodiment of the present invention.

Hence, as shown in FIGS. 5A and 5B, the electrodes 12 and 22 formed on the electronic component 10 and the circuit board 20 are coated by the adhesive films 30A and 30B, respectively. During the coating process, by performing the coating with pressure and heat, it is possible for the adhesive films 30A and 30B to positively adhere to the electrodes 12 and 22, respectively. The adhesive films 30A and 30B are film resins. For the film resins, a thermosetting resin, a thermoplastic resin, or a mixture of a thermosetting resin and a thermoplastic resin may be used. For example, the thermosetting resin may be epoxy resin such as bisphenol-A epoxy resin, dicyclopentadien type epoxy resin, cresol novolak epoxy resin, biphenyl epoxy resin and naphthalene type epoxy resin, or phenolic resin such as resol type phenolic resin and novolak phenolic resin. In addition, the thermoplastic resin may be, for example, polyimide, polyamide, polyamide-imide, acrylic resin, polyester resin, ABS resin, polycarbonate resin, phenoxy resin or the like.

As described above, it is possible to maintain the sealing effect even when the electronic component 10 and the circuit board 20 are taken out from the electrode surface activation apparatus 41 and placed in the air, by coating the activated component-side electrodes 12 and board-side electrodes 22 (component-side bonding surfaces 12a and board-side bonding surfaces 22a) with the adhesive films 30A and 30B, respectively. Therefore, the activated state of each of the bonding surfaces 12a and 22a is maintained by the adhesive films 30A and 30B, respectively.

In addition, since the inside of the coating apparatus 45 is in the inert gas atmosphere as mentioned above, there is no air causing oxidation of the electrodes between the electrodes 12 and 22 and the adhesive films 30A and 30B, respectively. Accordingly, it is possible to securely maintain the activated state of the electrodes 12 and 22. Further, the activated state of the bonding surfaces 12a and 22a are maintained by using the adhesive films 30A and 30B. Thus, the process becomes easier compared with other coating processes (for example, coating, plating, sputtering and so on). Accordingly, it is possible to correspond to the automation of the coating process of each of the electrodes 12 and 22 easily.

In addition, when there is a relatively long time until solid state bonding (that will be described later) is performed after the electrodes 12 and 22 are sealed with the adhesive films 30A and 30B, respectively, it is preferable that the electronic component 10 and the circuit board 20 coated with the adhesive films 30A and 30B, respectively, be maintained in an environment excluding the air by placing the electronic component 10 and the circuit board 20 in a vacuum desiccator or the like, for example.

The connecting apparatus 42 is the flip chip bonder as described above. The connecting apparatus 42 performs the bonding process of the electronic component 10 and the circuit board 20. The flip chip bonder forming the connecting apparatus 42 is generally used in the semiconductor manufacturing processes and the like.

Consequently, unlike the activation apparatus 44 and the coating apparatus 45, the connecting apparatus 42 is not provided with a mechanism for setting the inert gas atmosphere or the vacuum atmosphere. Accordingly, the equipment cost of connecting the electronic component 10 and the circuit board 20 is reduced. At the same time, the throughput of the connection process is improved, and thus it is possible to correspond to the mass production process.

Figure 6:
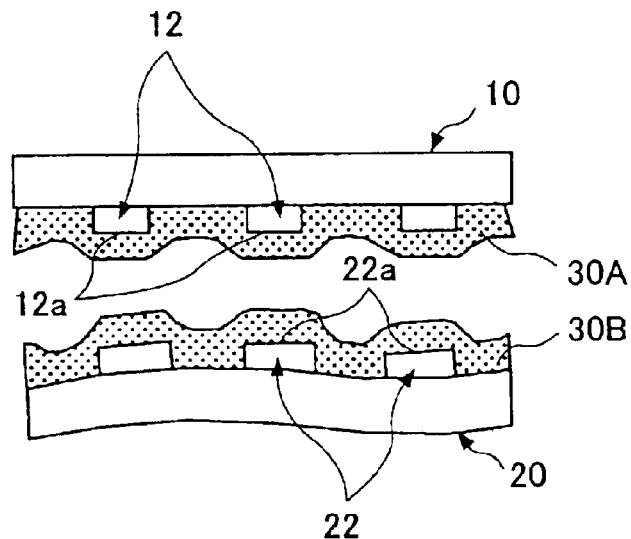
FIG. 6 is a side view showing the electronic component and the circuit board located such that the respective electrodes face each other and for explaining the electrode connection method according to the first embodiment of the present invention.
Figure 7:
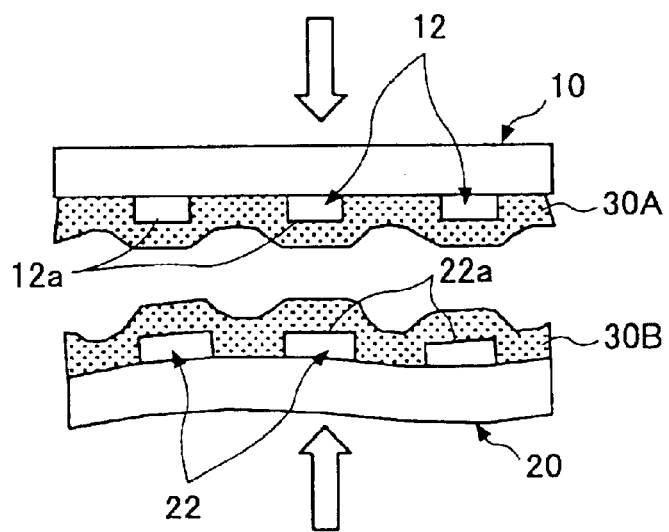
FIG. 7 is a side view showing a state where the electrodes of the electronic component and the electrodes of the circuit board are heated and force is applied, and for explaining the electrode connection method according to the first embodiment of the present invention.

When the electronic component 10 and the circuit board 20 are carried inside the connecting apparatus 42, as shown in FIG. 6, the electronic component 10 coated with the adhesive film 30A and the circuit board 20 coated with the adhesive film 30B are located such that the component-side electrodes 12 and the board-side electrodes 22 face each other. Subsequently, as shown in FIG. 7, the electronic component 10 and the circuit board 20 are welded together with pressure and heat. The pressure welding is performed while correcting the shapes of the electronic component 10 and the circuit board 20 so that warping is not caused.

Hence, the solid state bond between the component-side electrodes 12 and the board-side electrodes 22 is formed by breaking through the adhesive films 30A and 30B. At this moment, the adhesive films 30A and 30B are cured without entering between the electrodes 12 and 22. Thus, it is possible to form the solid state bond having a low interconnection resistance.

Figure 8:
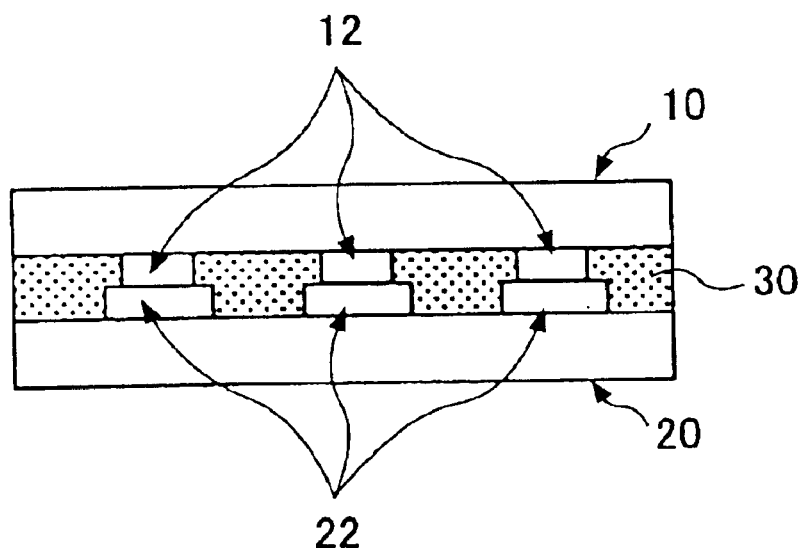
FIG. 8 is a side view showing a state where the electrodes of the electronic component and the electrodes of the circuit board are connected and for explaining the electrode connection method according to the first embodiment of the present invention.

Additionally, as shown in FIG. 8, in a state where the component-side electrodes 12 and the board-side electrodes 22 are connected, the adhesive film 30 lies between the electronic component 10 and the circuit board 20. Thus, the adhesive film 30 functions as an under fill resin. Accordingly, it is possible to reinforce the bonding of the component-side electrodes 12 and the board-side electrodes 22.

Further, as mentioned above, in this embodiment, since respective electrodes 12 and 22 are formed by protruding electrodes (bumps), it is possible to surely perform the process of breaking through the adhesive films 30A and 30B in the solid state bonding. Accordingly, it is possible to positively prevent the adhesive films 30A and 30B from remaining in between the component-side electrodes 12 and the board-side electrodes 22. Thus, the solid state bonding of both electrodes 12 and 22 can be surely formed.

Next, a description will be given of a third embodiment of the present invention. It should be noted that, in a connection method of electronic components according to the present invention, components to be connected are connected by employing the flip chip bonding method, and at least one of the components is an electronic component such as a semiconductor chip and both components have electrodes. The other one of the components may be a board for mounting the electronic component, or another electronic component.

The electrode surfaces of at least one of the components to be connected are coated with a metal material having a Young's modulus equal to or less than 50 GPa. As examples of the metal material having Young's modulus equal to or less than 50 GPa, there are various solder materials such as Sn and Sn alloy (for example, Sn—Ag, Sn—Bi, Sn—Ag—Cu, Sn—In, and Sn—Pb alloy). These metals or alloy materials easily form a solid solution with materials generally used for the electrodes of the electronic components and can form a strong bond. Thus, the metals and alloy materials are suitable for the connection between the components to be connected by the solid state bonding according to the present invention.

It is important for the metal material coating the electrode surfaces to have a Young's modulus equal to or less than 50 GPa. Such a metal material having a comparatively low Young's modulus is easily leveled through plastic deformation when the load is applied for forming a solid state bond between the components. Hence, it is possible to form a firm solid state bond between the components without performing a complex planarizing process by such as CMP.

Generally, it is impossible to firmly bond the electrodes having irregularities of the order of submicrons or microns on their surfaces, unless the amount of the metal material on the electrodes is small (adequate) and the metal material forms a layer of an appropriate thickness. On the other hand, it is not preferable to increase the amount of the metal material on the electrodes more than necessary. The reason is that the metal material may flow out of the electrode area by plastic deformation due to the load in forming the solid state bond and cause a short between adjacent electrodes especially in a case where the electrodes are formed with narrow pitches. In general, when the metal material is applied to the electrodes in an amount that forms a layer of 5 μm thickness, the plastically deformed metal material is sufficiently supplied to the concave portions on the electrode surfaces having the irregularities of the order of submicrons and microns. Thus, the solution using the material of the electrodes and the metal material is sufficient. Accordingly, it is possible to form the solid state bond with high reliability without causing a short between adjacent electrodes even when the electrodes are formed with minute pitches. Therefore, generally, it is sufficient to set approximately 5 μm for the upper limit of the thickness of the metal material applied to the electrodes. Of course, there may be a case where it is necessary to more thickly apply the metal material, according to the condition of the irregularity on the electrode surfaces.

Arbitrary methods may be employed to coat the electrodes of the components with the metal material, as long as the components are not harmfully affected. As examples of such methods, there are the dipping method of dipping the components in the melted metal material, the ultrasonic soldering method of dipping the components in the melted metal material under the application of ultrasonic waves, the transfer (print) method, and the like.

Normally, an oxide film is formed on the electrode surfaces to which the metal material is applied. In the connection by the solid state bonding, it is possible to form a firm solid state bond such that the metal material of the electrodes and the metal adhering to the electrode surfaces directly contact each other. Consequently, in order to achieve the firmer connection between the components by the solid state bonding, it is preferable to apply the metal material to the electrode surfaces after eliminating the oxide film thereon. For example, when the sputtering method is employed, it is possible to apply the metal material to the electrodes while eliminating the oxide film. In addition, the oxide films on the electrode surfaces can be eliminated by irradiating (treatment by plasma) with an inert ion beam or a neutral atom beam.

Following the application of the metal material for bonding to the electrode surfaces, activation is performed on the surface of the metal material applied to the electrodes and the electrode surfaces of the component when there is a component to which electrode surfaces the metal material is not applied. The activation is the process of exposing the metal material itself of the electrodes and the metal material for bonding itself to the surface by eliminating the oxide films formed on the surface of the metal material applied to the electrodes as well as the electrode surfaces to which the metal material is not applied. The process can be performed by irradiating (a plasma treatment) an inert ion beam or a neutral atom beam, for example. According to the process, it is possible to eliminate contamination such as moisture and fats and oils as well as the oxide film on the surface of the metal material. The elimination of the oxide film may be performed by the reduction of an oxide in a heated carboxylic acid atmosphere, for example, in the vapor of formic acid of 250° C. The specific methods of the activation process are not limited to the above-described methods. Any methods may be employed as long as the methods do not have harmful effect on the components to be connected.

The components after the activation process of the surface of the metal material are positioned and superposed on each other such that the respective electrodes face each other and make contact via the metal material for bonding. Then, the components are pressed to form a solid state bond. Thus, it is possible to bond the components firmly at room temperature. The solid state bond may be formed under the condition that the temperature is raised equal to or less than the melting point of the metal material for bonding applied to the electrodes. However, such heating is not always necessary. The suitable load in pressing may be selected according to the kinds of the components or the kind of the metal material for bonding.

The two components that are connected as mentioned above form a connected structure in which both electrodes are firmly connected via the metal material for bonding between the electrodes.

A description will be given of a third embodiment of the present invention.

Figure 9A:
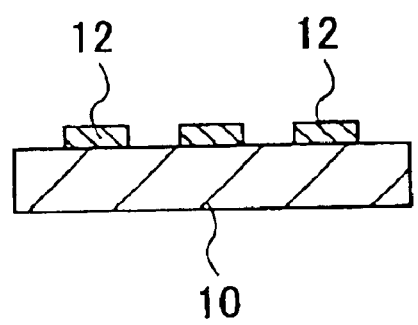
FIG. 9A is a side view of the electronic component 10 for explaining a third embodiment of the present invention.
Figure 9B:
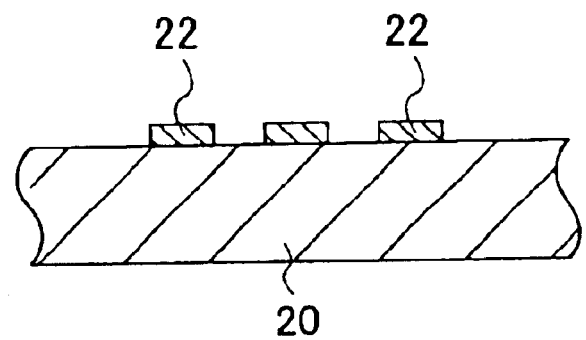
FIG. 9B is a side view of the circuit board 20 for explaining the third embodiment of the present invention.

First, as shown in FIGS. 9A and 9B, the protruding electrodes 12 and 22 are formed on the electrode forming parts of the semiconductor chip (electronic component) 10 and that of the circuit board 20, respectively, by a common electroless plating method.

Figure 10:
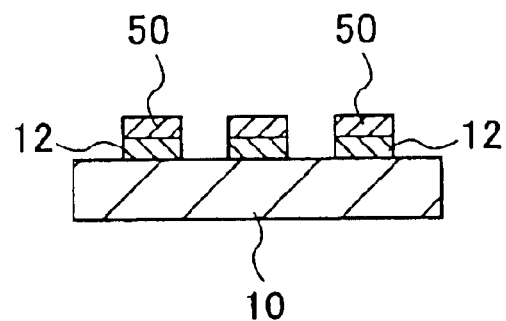
FIG. 10 is a side view of the electronic component 10 to which electrodes Sn—Ag solder is applied.

Next, as shown in FIG. 10, Sn—Ag solder is applied on the protruding electrodes 12 of the semiconductor chip 10 by ultrasonic soldering. Sn—Ag solder layers 50 of approximately 5 µm thickness are formed on the electrodes 12 such that the solder bath equipped with an ultrasonic transducer having output power of 40W and frequency of 20 kHz is used, the temperature of the solder bath is set to 280° C. while a nitrogen gas flows at 60 L/min, and the semiconductor chip 10 is dipped into the solder bath for 0.5 to 2 seconds, taken out from the solder bath and the solder is solidified.

Figure 11A:
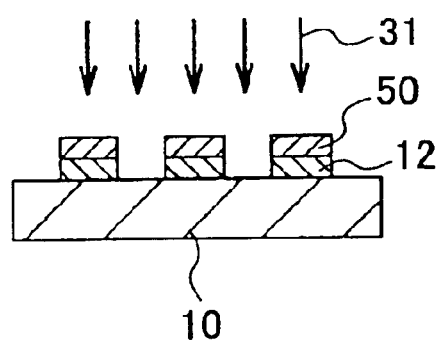
FIG. 11A is a side view of the electronic component 10 put in a chamber and irradiated with argon plasma.
Figure 11B:
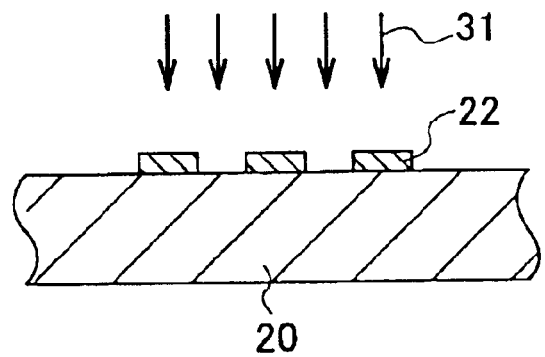
FIG. 11B is a side view of the circuit board 20 put in the chamber and irradiated with argon plasma.

Then, as shown in FIGS. 11A and 11B, the semiconductor chip 10 and the circuit board 20 are put in a chamber (not shown) maintaining an atmosphere where argon plasma 31 can be irradiated. Then the argon plasma 31 is irradiated so as to etch the surfaces of the solder layers 50 formed on the electrodes 12 of the semiconductor chip 10 and the surfaces of the electrodes 22 of the circuit board 20. Hence, the oxide films on the surfaces of the solder layers 50 and the electrodes 22 are eliminated together with moisture and fats and oils. Thus, the respective surfaces of the solder layers 50 and the electrodes 22 are activated.

Figure 12:
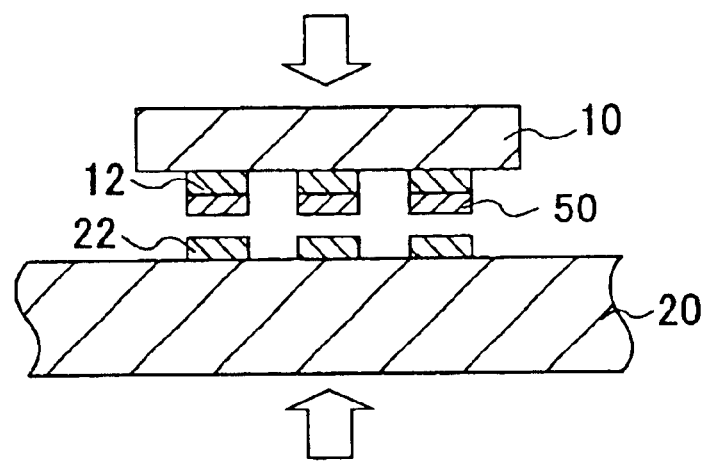
FIG. 12 is a side view showing the electronic component 10 and the circuit board 20 that are positioned and stacked such that the respective electrodes face and contact each other via a solder layers.
Figure 13:
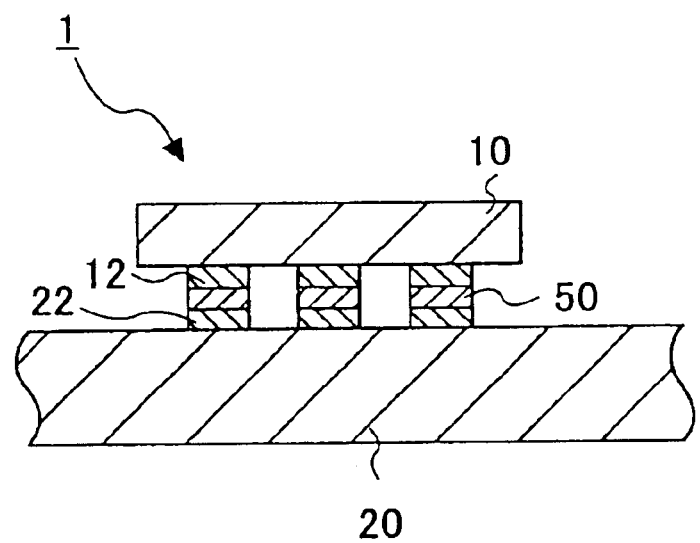
FIG. 13 is a side view of a connected structure according to the third embodiment of the present invention.

Subsequently, the chamber is maintained to have a vacuum atmosphere inside (or an atmosphere where oxygen does not exist such as an inert gas atmosphere). As shown in FIG. 12, the semiconductor chip 10 and the circuit board 20 are positioned and stacked such that the respective electrodes 12 and 22 face and contact each other via the solder layers 50. Then, the semiconductor chip 10 and the circuit board 20 are pressed by 5 through 10 N/mm$^2$ at room temperature so as to form a solid state bond. Hence, a connected structure 1 of the semiconductor chip 10 and the circuit board 20 as shown in FIG. 13 is obtained. In the connected structure 1, the semiconductor chip 10 and the circuit board 20 are firmly connected via the respective electrodes 12 and 22 and the Sn—Ag solder layers 50 therebetween.

In the third embodiment, the solder layers 50 are formed on the electrodes 12 of the semiconductor chip 10. However, such solder layers may be formed on the electrodes 22 of the circuit board 20, or on both electrodes 12 and 22.

The present invention is not limited to the specifically disclosed embodiments, and variations and modifications may be made without departing from the scope of the present invention.

What is claimed is:

1. An electrode connecting method of connecting a first electrode and a second electrode, comprising the steps of:
   (a) activating respective bonding surfaces of the first and second electrodes;
   (b) coating each of the first and second electrodes having the activated bonding surfaces with a coating member for maintaining an activated state; and
   (c) forming a solid state bond between the first and second electrodes by pressure welding the first and second electrodes so that the first and second electrodes break through the coating members.

2. The electrode connecting method as claimed in claim 1, wherein when activating respective bonding surfaces of the first and second electrodes, the activation is performed by eliminating oxide films formed on the bonding surfaces.

3. The electrode connecting method as claimed in claim 1, wherein etching by irradiating plasma is used as the activation process for activating the respective bonding surfaces of the first and second electrodes.

4. An electrode connecting method of connecting a first electrode and a second electrode, comprising the steps of:
   (a) activating respective bonding surfaces of the first and second electrode;
   (b) coating each of the first and second electrodes having the activated bonding surfaces with a coating member for maintaining an activated state; and
   (c) forming a solid state bond between the first and second electrodes by pressure welding the first and second electrodes so that the first and second electrodes break through the coating members,
   wherein reduction of a formic acid is used as the activation process of activating the respective bonding surfaces of the first and second electrodes.

5. The electrode connecting method as claimed in claim 1, wherein an adhesive film having an electrical insulation property is used as the coating member for maintaining the activated state.

6. The electrode connecting method as claimed in claim 1, wherein the step (b) is performed in an inert gas atmosphere.

7. The electrode connecting method as claimed in claim 1, wherein the first and second electrodes are protruding electrodes formed on respective boards.

8. A method of directly connecting components via respective electrodes, each component having an electrode and at least one of the components being an electronic component, comprising the steps of:
   (a) applying a metal material having Young's modulus of equal to or less than 50 GPa to a surface of the electrode of at least one of the components;
   (b) activating a surface of the metal material and a surface of the electrode of another component when the metal material is not applied to the surface of the electrode of the other component;
   (c) coating each of the electrodes having the activated bonding surfaces with a coating member for maintaining an activated state; and
   (d) connecting the components by forming a solid state bond between the respective electrodes of the components via the applied metal material by pressure welding the electrodes so that the electrodes break through the coating.

9. The method as claimed in claim 8, wherein the metal material applied to the surface of the electrode is selected from among a Sn, a Sn—Ag alloy, a Sn—Bi alloy, a Sn—Ag—Cu alloy, a Sn—In alloy and a Sn—Pb alloy.

10. The method as claimed in claim 8, wherein the metal material applied to the surface of the electrode has a thickness equal to or less than 5 µm.

11. The method as claimed in claim 8, wherein the metal material is applied by one of a dipping method, an ultrasonic soldering method, and a transfer method.

12. A method of directly connecting components via respective electrodes, each component having an electrode and at least one of the components being an electronic component, comprising the steps of:

(a) applying a metal material having Young's modulus of equal to or less than 50 GPa to a surface of the electrode of at least one of the components;

(b) activating a surface of the metal material and a surface of the electrode of another component when the metal material is not applied to the surface of the electrode of the other component; and (c) connecting the components by forming a solid state bond between the respective electrodes of the components via the applied metal material, wherein the step (b) is performed by one of irradiating plasma and exposing to a heated carboxylic acid atmosphere.

13. The method as claimed in claim 8, wherein one of the components is a semiconductor chip and the other of the components is either a board mounting the semiconductor chip or another semiconductor chip.

14. A connected structure in which components are directly connected via respective electrodes and a metal material for bonding arranged between the electrodes, wherein the components are connected by a method comprising the steps of:

(a) applying a metal material having Young's modulus of equal to or less than 50 GPa to a surface of the electrode of at least one of the components;

(b) activating a surface of the metal material and a surface of the electrode of another component when the metal material is not applied to the surface of the electrode of the other component;

(c) coating each of the electrodes having the activated bonding surfaces with a coating member for maintaining an activated state; and (d) connecting the components by forming a solid state bond between the respective electrodes of the components via the applied metal material by pressure welding the electrodes so that the electrodes break through the coating.

* * * * *